United States Patent
Kollmer et al.

(10) Patent No.: US 8,525,125 B1
(45) Date of Patent: Sep. 3, 2013

(54) LIQUID METAL ION SOURCE AND SECONDARY ION MASS SPECTROMETRIC METHOD AND USE THEREOF

(71) Applicants: Felix Kollmer, Altenberge (DE); Peter Hoerster, Muenster (DE); Andreas Duetting, Greven (DE)

(72) Inventors: Felix Kollmer, Altenberge (DE); Peter Hoerster, Muenster (DE); Andreas Duetting, Greven (DE)

(73) Assignee: ION-TOF Technologies GmbH, Muenster (DE)

( * ) Notice: Subject to any disclaimer, the term of this patent is extended or adjusted under 35 U.S.C. 154(b) by 0 days.

(21) Appl. No.: 13/832,684

(22) Filed: Mar. 15, 2013

Related U.S. Application Data

(62) Division of application No. 12/739,993, filed as application No. PCT/EP2008/008781 on Oct. 16, 2008, now Pat. No. 8,410,425.

(30) Foreign Application Priority Data

Oct. 29, 2007 (EP) ..................................... 07021097

(51) Int. Cl.
*H01J 49/26* (2006.01)
*H01J 27/02* (2006.01)

(52) U.S. Cl.
USPC ....... 250/423 R; 250/288; 250/282; 250/281; 250/424

(58) Field of Classification Search
USPC ................. 250/281, 282, 287, 288, 290, 293, 250/423 R, 424, 425
See application file for complete search history.

(56) References Cited

U.S. PATENT DOCUMENTS

| | | | |
|---|---|---|---|
| 3,508,045 A | 4/1970 | Liebl et al. ..................... 250/282 |
| 4,426,582 A * | 1/1984 | Orloff et al. ........... 250/396 ML |
| 4,503,329 A | 3/1985 | Yamaguchi et al. .............. 850/1 |
| 4,609,809 A | 9/1986 | Yamaguchi et al. ..... 219/121.35 |
| 4,818,872 A | 4/1989 | Parker et al. ...................... 850/1 |
| 4,857,156 A * | 8/1989 | Fray et al. ..................... 205/364 |
| 4,912,327 A | 3/1990 | Waugh ............................. 850/9 |
| RE33,193 E | 4/1990 | Yamaguchi et al. ........... 250/309 |
| 5,774,514 A * | 6/1998 | Rubbia .......................... 376/193 |
| 5,905,259 A | 5/1999 | Franzen ........................ 250/287 |
| 6,002,128 A * | 12/1999 | Hill et al. ...................... 250/287 |
| 6,989,528 B2 * | 1/2006 | Schultz et al. ................ 250/281 |
| 7,629,577 B2 | 12/2009 | Jindai et al. ................... 250/309 |

(Continued)

FOREIGN PATENT DOCUMENTS

DE 103 39 346 A1 8/2003

OTHER PUBLICATIONS

I.S. Gilmore et al. "Static SIMS: towards unfragmented mass spectra—the G-SIMS procedure", Applied Surface Science 161 (2000) pp. 465-480.

(Continued)

*Primary Examiner* — Bernard E Souw
(74) *Attorney, Agent, or Firm* — Karl F. Milde, Jr.; Eckert Seamans Cherin & Mellott, LLC

(57) ABSTRACT

A liquid metal ion source for use in an ion mass spectrometric analysis method contains, on the one hand, a first metal with an atomic weight $\geq 190$ U and, on the other hand, another metal with an atomic weight $\leq 90$ U. One of the two types of ions are filtered out alternately from the primary ion beam and directed onto the target as a mass-pure primary ion beam.

19 Claims, 4 Drawing Sheets

(56) References Cited

U.S. PATENT DOCUMENTS

| | | | |
|---|---|---|---|
| 7,635,840 B2 * | 12/2009 | Jindai et al. | 250/287 |
| 7,714,280 B2 * | 5/2010 | Komatsu et al. | 250/287 |
| 7,902,497 B2 | 3/2011 | Gohl et al. | 250/282 |
| 8,003,939 B2 | 8/2011 | Jindai et al. | 250/309 |
| 8,410,425 B2 * | 4/2013 | Kollmer et al. | 250/282 |
| 2006/0202130 A1 * | 9/2006 | Kollmer et al. | 250/423 R |
| 2008/0210854 A1 | 9/2008 | Jindai et al. | 250/281 |
| 2008/0210855 A1 | 9/2008 | Gohl et al. | 250/282 |
| 2009/0162278 A1 * | 6/2009 | Ravn et al. | 424/1.37 |
| 2010/0038531 A1 | 2/2010 | Jindai et al. | 250/287 |
| 2010/0181473 A1 | 7/2010 | Blenkinsopp et al. | 250/282 |
| 2012/0018630 A1 * | 1/2012 | Schultz et al. | 250/282 |
| 2012/0104249 A1 * | 5/2012 | Kollmer et al. | 250/288 |

OTHER PUBLICATIONS

Noothoven Van Goor, J.M. Ziolstra, H., "Structural and Magnetic Properties of a B1-MnB1 Composite", Journal of Applied Physics, Bd. 39, Nr. 12, Nov. 1968, pp. 5471-5474.

Kleppa, O.J., "A Thermodynamic Study . . . ", Journal of the American Chemical Society, Bd. 74, Dec. 5, 1952, pp. 6047-6051.

\* cited by examiner

LIQUID METAL ION SOURCE AND SECONDARY ION MASS SPECTROMETRIC METHOD AND USE THEREOF

CROSS-REFERENCE TO RELATED APPLICATION

This application is a divisional of U.S. patent application Ser. No. 12/739,993, filed May 7, 2010, now pending. This application claims priority from this parent application Ser. No. 12/739,993. The invention disclosed and claimed herein is related in subject matter to that disclosed in International Patent Application No. PCT/EP08/08781, filed Oct. 16, 2008 and European Patent Application No. 07021097.6, filed Oct. 29, 2007, all of which are incorporated herein by reference.

BACKGROUND OF THE INVENTION

The present invention relates to a liquid metal ion source, a secondary ion mass spectrometer, and also a secondary ion mass spectrometric analysis method as well as the use thereof.

Secondary ion mass spectrometry is operated inter alia as so-called "Static Secondary Ion Mass Spectrometry" (SSIMS). An energy-rich primary ion beam is thereby directed onto a substrate surface to be analyzed. When impinging on the substrate, the primary ion beam strikes so-called secondary ions out of the material which are subsequently analyzed. From this analysis, the material of the surface can be determined. In order to obtain information about the distribution of specific substances over the surface, the primary ion beam can scan the surface. In order to obtain depth information, the beam is directed onto a specific place of the surface and removes the latter in the course of time so that also deeper layers can be exposed and analyzed. Also a combination of scanning of the surface with a depth profile analysis is possible.

A conventional static secondary ion mass spectrometric method is disclosed for example in DE 103 39 346 A1.

The method mentioned amongst experts under the name "Gentle Secondary Ion Mass Spectrometry" (Gentle SIMS or G-SIMS) has been available for some time for the analysis of surfaces. This is described for example in I. S. Gilmore et al. "Static SIMS: towards unfragmented mass spectra—the G-SIMS procedure", Applied Surface Science 161 (2000) pp. 465-480.

This method termed G-SIMS was introduced in 1999 by I. S. Gilmore. The aim of the application of the G-SIMS method is to reduce the complexity of a TOF-SIMS spectrum (time-of-flight mass spectrometry) and to simplify the interpretation. This is because a TOF-SIMS spectrum has a large number of secondary ion lines/peaks. Such a secondary ion mass spectrometric spectrum is shown in FIG. 1. In addition to the characteristic lines for the polycarbonate sample examined here, this spectrum has a large number of intensive non-specific signals, such as for example polycyclic aromatic hydrocarbons. The conventional interpretation of such a spectrum presupposes empirical knowledge. Spectrum libraries are helpful in addition for the interpretation. Since the bombardment conditions have however great influence on the relative peak intensities of a TOP-SIMS spectrum, spectra of the same substance can deviate significantly from each other. With increasing numbers of primary ion sources and use of different bombardment conditions, the construction of a spectrum library is increasingly more difficult.

FIG. 2 now shows the same TOF-SIMS spectrum as in FIG. 1, but after application of the G-SIMS method. It is immediately obvious that the spectrum is very much simplified. Characteristic peaks are emphasised whilst non-specific fragments are suppressed. This significantly facilitates identification of molecular groups and the interpretation of the spectrum relative to the conventional TOF-SIMS spectrum. The application of the G-SIMS algorithm therefore makes it possible for the expert to have a rapid overview and delivers additional information for achieving a reliable interpretation of the data. Also easier access for interpretation of the data is made possible for the less experienced user.

Since G-SIMS spectra have only low dependency upon the bombardment conditions, the construction of spectrum libraries is substantially easier for the G-SIMS procedure than for the conventional TOF-SIMS method.

The G-SIMS method now presupposes the existence of two spectra with greatly different fragmentation behaviour. This fragmentation behaviour can be influenced very greatly by the energy and the mass of the primary ions which are used. In particular the influence of the primary ion mass on the fragmentation behaviour is important. This is because generally the fragmentation reduces with increasing mass of the primary ion. The strongest fragmentation can be achieved in contrast by choosing lighter high-energy atomic primary ions. By choosing heavier monoatomic or polyatomic bombardment particles, the emission spectrum is therefore displaced generally to higher masses and the fragmentation is significantly reduced. Uncharacteristic fragment peaks react therefore significantly more to the changed bombardment conditions than sample-specific molecular signals.

In the G-SIMS method which is mentioned in the above-mentioned publication by I. S. Gilmore et al. with more details than can be mentioned here, two spectra with greatly different fragmentation behaviour are recorded. After suitable normalisation, the spectra are divided such that signals which greatly differ in both spectra are suppressed. Signals which have only a small difference in both spectra are correspondingly amplified. A subsequent raising to a power of the quotient of both spectra increases these effects again significantly.

The G-SIMS method is in fact held in high regard, but in practical laboratory use, has to date only limited acceptance. This resides inter alia in the fact that the experimental complexity for this method is very great. This is because the required spectra with greatly different fragmentation behaviour can be achieved to date only by using different analysis sources.

On the one hand, gas ion sources are available which are able in principle to produce a series of differingly heavy atomic primary ions (Ar, Ne, Xe) and also polyatomic primary ions ($SF_5$). The change between different species of primary ions is however very complex with these gas sources. Furthermore, these sources deliver only a restricted performance with respect to the achievable lateral resolution and mass resolution.

Alternatively, a plurality of different primary ion sources (e.g. with Ga or $SF_5$) can be operated simultaneously. However, this demands high technical outlay, the achievable performance of such a G-SIMS analysis being limited by the weakest of the sources which are used. The required spectra can only be acquired here in succession so that the temporal complexity is very great.

Also commercially available cluster sources with Au or Bi have been proposed as emitter material. The emission spectra of such sources have both atomic and intensive polyatomic species. However is was quickly shown that the required strong variation in fragmentation with these sources could not be achieved. This is because the use of the clusters as analysis species leads in fact to spectra of low fragmentation, as are required for the successful application of the G-SIMS procedure. The maximum fragmentation in this case is however achieved by the use of the atomic species, the fragmentation being relatively low because of the large mass of the Au or Bi in the monoatomic primary ion beam and the achievable variation in fragmentation between the use of the clusters as primary ion beam and the use of monoatomic primary ions as primary ion beam not being sufficient.

To date, no primary ion sources which would be suitable for successful implementation of the G-SIMS method are therefore known.

SUMMARY OF THE INVENTION

The principal object of the present invention is therefore to make available new ion sources which can be used advantageously in secondary ion mass spectrometry. A further object is to make available an advantageous secondary ion mass spectrometer and also a mass spectrometric analysis method.

The present invention makes available a secondary particle mass spectrometric analysis method in which different filtered primary ion beams are produced alternately. A primary ion source is thereby used which produces, on the one hand, monoatomic or polyatomic ions of a first heavy metal with an atomic $\geq 190$ u and also monoatomic ions of a further light metal with an atomic weight $\leq 90$ u. According to the invention, a respectively extensively or completely mass-pure filtered primary ion beam is filtered out of this primary beam by means of a filter device (filtering according to mass and charge of the ion species which is to be filtered out). This filtered primary ion beam contains either the monoatomic or polyatomic ions of the first metal or the ions of the further metal. In this way, two primary ion beams are made available alternately from the same ion source and, after filtering, effect a very different fragmentation of the sample to be analyzed even if the same or similar acceleration voltages are used for the different filtered primary ion beams. By means of such a method according to the invention, it is possible, in addition to the conventional static secondary ion mass spectrometries, also to implement the Gentle-SIMS spectroscopy which was only recently developed. In particular, this method fulfils ideally the requirements that, without great temporal losses, such as e.g. change of ion source, two greatly differently fragmented spectra can be determined and subsequently evaluated. The primary ion source used in this method therefore covers completely the range of light atomic primary ions as far as heavy polyatomic primary ions of different charge states.

In the case of a G-SIMS analysis with the analysis method according to the invention, this method can be represented as follows:

The liquid metal ion source emits primary ions of two different metals M1 and M2. The ions of the species M1 used for the analysis have a mass >190 u and are mono- or polyatomic. The ions of the species M2 used have a mass <90 u and are monoatomic.

For the G-SIMS analysis, the surface is firstly analyzed with a type-pure ion beam either of the mass M1 or the mass M2. The primary ion dose is thereby kept so low that no noteworthy damage to the surface takes place (static bombardment range). Subsequently, the surface is analyzed with the species M1 or M2 which was not previously used. The exchange between the primary ion types can thereby be effected several times.

The secondary ion spectra produced by the analysis with M1 and M2 are subsequently treated according to the G-SIMS method. By applying the G-SIMS algorithm, the two secondary ion spectra are combined to form a G-SIMS spectrum.

As a result of the possibility of rapid and repeated switching between the masses M1 and M2, the G-SIMS spectra can be produced already during the analysis.

Advantageously, the further metal has an isotopic distribution in which the natural or enriched main isotope in the liquid metal ion source has a proportion $\geq 80\%$, advantageously $\geq 90\%$, advantageously $\geq 95\%$ of the total proportion of the further metal in the emission spectrum of the liquid metal ion source.

The proportion of mixed clusters from the first metal and further metal in the primary ion beam emitted from the liquid metal ion source before the filtering is intended advantageously to be $\leq 10\%$, relative to the entire emission spectrum.

The proportion of ions of the first metal, in particular of bismuth ions, in the liquid metal ion source according to the invention and/or of the emitted primary ion beam is advantageously $\geq 50\%$, advantageously $\geq 90\%$. Advantageously one of the metals bismuth, gold and lead or mixtures hereof are suitable as first metal.

The proportion of ions of the further metal in particular of manganese, in the liquid metal ion source and/or in the primary ion beam emitted by the liquid metal ion source is before filtering advantageously $\geq 0.5\%$, advantageously $\geq 2\%$. It is advantageously delimited at the top to $\leq 50\%$, advantageously $\leq 10\%$ of the liquid metal ion source and/or the emitted primary ion beam before filtering of the liquid metal ion source.

Together, the proportion of ions of the first metal, in particular of the bismuth ions, together with the proportion of ions of the further metal, advantageously of manganese, in the metal alloy of the liquid metal ion source and/or in the primarily emitted primary ion beam, is advantageously before filtering $\geq 90\%$, advantageously $\geq 95\%$, advantageously $\geq 98\%$.

One of the metals bismuth, gold and lead or mixtures hereof is hereby suitable advantageously as metal.

In general, metals with a low atomic weight are advantageously used as further metal, the solubility of which metals in the first metal with a high atomic weight is $\geq 1\%$ and which have a narrow isotopic distribution. A further advantageous selection criterion for the choice of the further metal with a low atomic weight is that, during the ion beam production, it forms no or only low quantities of mixed clusters with the first metal with a high atomic weight.

There are suitable as further metal which has an atomic weight $\leq 90$ u in particular the following metals or mixtures hereof: lithium, beryllium, boron, sodium, magnesium, aluminium, silicon, potassium, calcium, scandium, titanium, vanadium, chromium, manganese, iron, cobalt, nickel, copper, zinc, gallium, germanium, arsenic, selenium, rubidium and yttrium.

Bismuth is used particularly advantageously as first metal with a high atomic weight $\geq 190$ u, advantageously one of a plurality of bismuth ion types, the mass of which is approximately or precisely a multiple of the monoatomic bismuth ion charged once or several times, being filtered out from the primary ion beam, as mass-pure filtered primary ion beam. Manganese has proved to be particularly advantageous as further metal, manganese being available as further metal with a low atomic weight $\leq 90$ u for filtering out the filtered primary ion beam with high fragmentation.

If bismuth is used as first metal, then the primary ion beam, after filtering and selection, contains ions of the first heavy metal with an atomic weight $\geq 190$, advantageously bismuth ions $Bi_n^{p+}$ of a single type in which $n \geq 2$ and $p \geq 1$ and n and p respectively is a natural number, the filtered primary ion beam advantageously contains $Bi_3^+$ ions or $Bi_3^{2+}$ ions or comprises such ions.

The analysis of the produced secondary particles can advantageously be effected with a magnetic sector field mass spectrometer, a quadrupole mass spectrometer or a time-of-flight mass spectrometer, both an image of the sample surface, for example by scanning, and a depth profile of the sample surface or even a combination hereof being able to be determined both for the static secondary ion mass spectrometry with one of the liquid metal ion sources according to the invention or with a secondary ion mass spectrometer according to the invention. This applies also to the method according to the invention, in particular if it is applied in a G-SIMS method.

For a full understanding of the present invention, reference should now be made to the following detailed description of the preferred embodiments of the invention as illustrated in the accompanying drawings.

DESCRIPTION OF THE PREFERRED EMBODIMENTS

Figure 1:
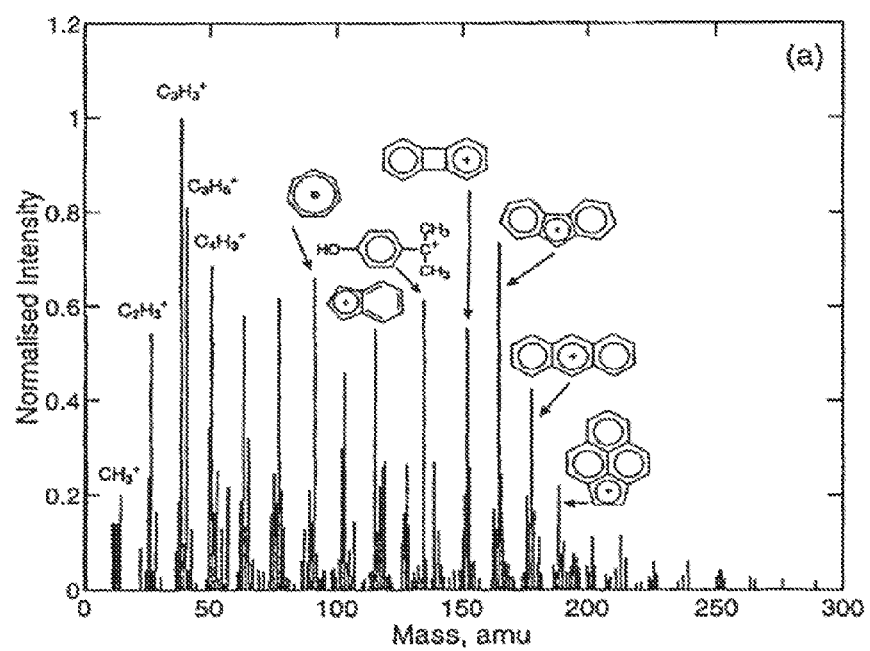
FIG. 1 is a TOF-SIMS spectrum of polycarbonate, recorded with argon ions with an energy of 10 keV as primary ion species.
Figure 2:
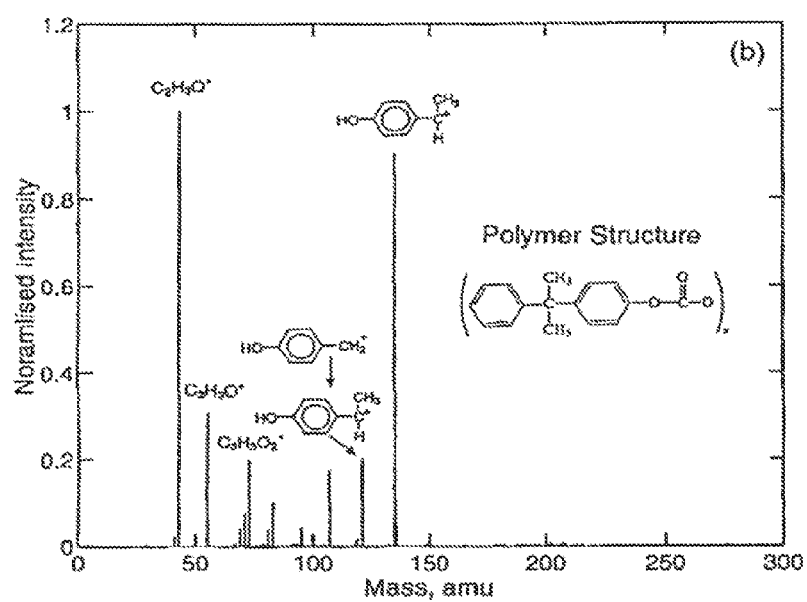
FIG. 2 is a G-SIMS spectrum of polycarbonate recorded with caesium ions with an energy of 10 keV and argon ions with an energy of 10 keV as primary ion species.

The preferred embodiments of the present invention will now be described with reference to FIGS. 1-4 of the drawings. Identical elements in the various figures are designated with the same reference numerals.

Figure 3:
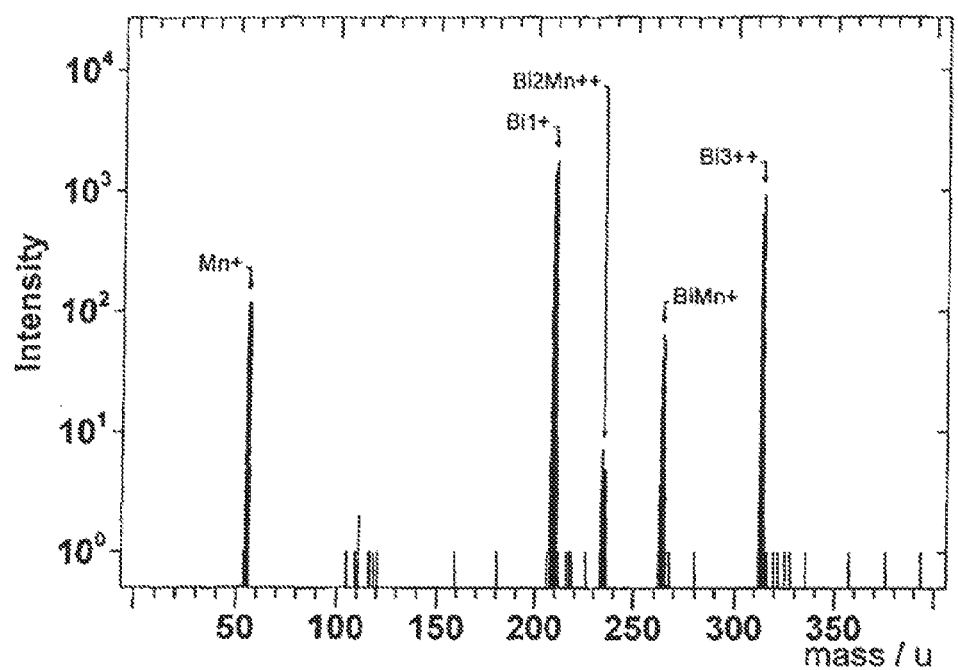
FIG. 3 is an emission spectrum of a BiMn emitter in the lower mass range.
Figure 4:
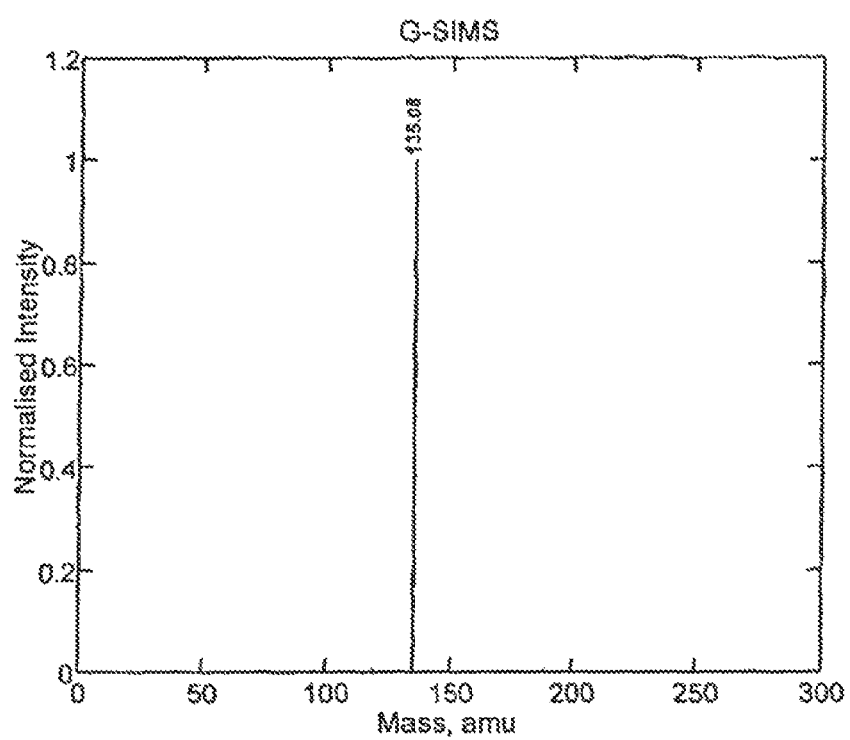
FIG. 4 is a G-SIMS spectrum of polycarbonate recorded with a BiMn liquid metal ion source with manganese ions with an energy of 25 keV and $Bi_3$ ions with an energy of 25 keV as primary ion species.

For implementation of the examples according to the invention, as are represented in FIGS. 3 and 4, a bismuth liquid metal ion cluster source which contained 95% bismuth and 5% manganese in the alloy was used.

According to the invention, it emerged that bismuth cluster sources are ideally suited because of the heavy and intensive clusters and the different charge states for varying the fragmentation in the spectrum of an S-SIMS method or a G-SIMS method. The maximum achievable variation in the fragmentation is however still too low when using a pure bismuth cluster source.

Therefore in the present examples, as light an alloy component as possible was added to the bismuth emitter, which alloy component emits atomic primary ions in the lower mass range of the emission spectrum. The added element was selected here on the basis of a series of boundary conditions:

Manganese was used as light alloy component. The latter, just like bismuth, has exclusively a single isotope and in principle forms an alloy with bismuth. It is soluble in bismuth up to at least a few percent, the proportion of manganese in the emission spectrum of the emitter essentially corresponding to the stoichiometric proportion in the alloy of the liquid metal ion source. This prevents enrichment and depletion processes in the manganese in the course of the measurement. Also merely low intensities of mixed clusters comprising bismuth and manganese occur. This prevents the achievable intensity of the desired atomic species being reduced by formation of mixed clusters and the usability of the emitted pure bismuth clusters being restricted by the presence of mixed bismuth-manganese clusters.

FIG. 3 now shows the emission spectrum of the bismuth manganese emitter according to the present invention. This obviously shows the hoped-for properties because the intensity of the bismuth emission with approx. 96% to the manganese emission with approx. 4% corresponds within the scope of the measuring precision to the stoichiometric composition of the alloy.

It is shown in FIG. 3 that manganese is emitted essentially as atomic ion, in particular as $Mn^+$ or $Mn^{2+}$. Mass interferences with the bismuth clusters in the upper mass range rarely occur. Because of the low added quantity of manganese, the intensity of the emitted bismuth clusters is hardly reduced by any possible mixed clusters comprising bismuth and manganese. The losses occurring with the source used in FIG. 3 with respect to the bismuth clusters are also insignificant for operation as bismuth cluster source.

For polycarbonate, FIG. 4 now shows the G-SIMS spectrum, recorded with the mentioned BiMn liquid metal ion source. As primary ion species, $Mn^+$ ions and $Bi_3^+$ ions were thereby used, a mass-pure primary ion beam of $Mn^+$ ions (25 keV) and a mass-pure primary ion beam of $Bi_3^+$ ions (25 keV) being produced from the produced primary ion beam of the BiMn source alternately by changing the filter parameters. In FIG. 2, the dominance of the characteristic peak of the mass 135 u relative to the original reference spectrum, as shown in FIG. 2, is now once again immediately significantly increased.

The results achieved with the BiMn emitter according to the invention are entirely positive. The obtained G-SIMS spectra fulfil all the criteria which can be placed upon a successful G-SIMS spectrum. This is, for example in the case of polycarbonate, the dominance of the characteristic peak of the mass 135 u in the total spectrum.

It is shown here therefore also experimentally that the liquid metal ion sources according to the invention and in particular the mass spectroscopic analysis method according to the invention are outstandingly suitable for mass spectroscopy, in particular the G-SIMS method.

The basic advantage of a mixed emitter of this type, here for example the BiMn emitter, resides in the fact that the secondary ion mass spectrometry, in particular in addition to the static SIMS method also the G-SIMS method, can be implemented with only one source and without changing the operating means.

Furthermore, the liquid metal ion source according to the invention and the method according to the invention has a few further advantages in principle with respect to use for the G-SIMS method.

The liquid metal ion sources, spectrometers and methods according to the invention use the different time-of-flight of different species for the mass filtering. The time-of-flight mass filtering now permits almost any rapid switching between different primary ion species. Because of the chosen production, the mass calibration of the spectrum is maintained when switching over the primary species. The arrangement hence offers the prerequisite of being able to calculate and indicate continuously the G-SIMS spectrum directly, even after a few analysis cycles. Hence a quasi simultaneous analysis of the sample with different primary ions is possible. Complex sequential analysis with different sources is no longer necessary. Even TOF-SIMS images of the sample surface can be represented in this way already after at least two image passes as G-SIMS image. The quasi simultaneous analysis permits in addition modes of operation which have not been conceivable to date for G-SIMS, e.g. the depth profiling of organic surfaces.

In particular during depth profiling or in grid scanning of a surface, this sample surface was massively changed during the bombardment in the method according to the state of the art in which firstly an analysis of the sample was examined with one of the primary ion species from a specific source. The subsequent analysis of the same sample surface effected after switching over the ion source to the other ion species leads necessarily to altered results since the sample surface for this second ion species was available only in altered form. With the method according to the invention, now a characterisation of the same surface in the same state is however possible on the basis of the rapid switching between the individual primary ion species and the hence quasi simultaneous analysis.

There has thus been shown and described a novel liquid metal ion source and secondary ion mass spectrometric method and use thereof which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. Liquid metal ion source which contains bismuth in an alloy, wherein the alloy contains a further metal with an atomic weight $\leq 90$ u, a solubility in bismuth $\geq 1\%$, with few or no isotopes or with an narrow isotope distribution and which, during the ion beam production, forms no or only small quantities of mixed clusters with bismuth.

2. Liquid metal ion source according to claim 1, wherein the alloy contains manganese as the further metal.

3. Liquid metal ion source which contains bismuth in an alloy, wherein the alloy contains manganese as a further metal.

4. Liquid metal ion source according claim 1, wherein the natural or enriched main isotope of the further metal has a proportion selected from the group consisting of $\geq 80\%$, $\geq 90\%$, and $\geq 95\%$ in the total proportion of the further metal in the liquid metal ion source.

5. Liquid metal ion source according to claim 1, wherein bismuth and the further metal form, during the ion beam production $\leq 10\%$ mixed clusters which contain bismuth and the further metal, relative to the total emission spectrum.

6. Liquid metal ion source according to claim 1, wherein the proportion of the further metal in the primary ion beam produced by the liquid metal ion source corresponds essentially to the stoichiometric proportion of the further metal in the alloy.

7. Liquid metal ion source according to claim 1, wherein the bismuth content in the alloy is $\geq 50\%$.

8. Liquid metal ion source according to claim 1, wherein the content of the further metal in the alloy is $\geq 0.5\%$.

9. Liquid metal ion source according to claim 1, wherein the content of the further metal in the alloy is $\leq 50\%$.

10. Liquid metal ion source according to claim 1, wherein bismuth and the further metal together in the alloy have a proportion selected from the group consisting of $\geq 90\%$, $\geq 95\%$ and $\geq 98\%$.

11. Liquid metal ion source according to claim 1, wherein the alloy is a low-melting alloy containing bismuth.

12. Liquid metal ion source according claim 1, wherein the alloy has a melting point below the melting point of pure bismuth.

13. Liquid metal ion source according to claim 1, wherein the metal alloy is an alloy of the further metal and bismuth and at least one of the following metals: Ni, Cu, Zn, Sc, Ga, Mn and Se.

14. Liquid metal ion source according to claim 5, wherein bismuth and the further metal form during the ion beam production $\leq 5\%$ mixed clusters which contain bismuth and the further metal, relative to the total emission spectrum.

15. Liquid metal ion source according to claim 1, wherein the proportion of the further metal in the primary ion beam produced by the liquid metal ion source is the same as the stoichiometric proportion of the further metal in the alloy.

16. Liquid metal ion source according to claim 7, wherein the bismuth content in the alloy is $\geq 90\%$.

17. Liquid metal ion source according to claim 8, wherein the content of the further metal in the alloy is $\geq 2\%$.

18. Liquid metal ion source according to claim 9, wherein the content of the further metal in the alloy is $\leq 10\%$.

19. Liquid metal ion source according to claim 1, wherein the alloy has a melting point $\leq 270°$.

* * * * *